(12) United States Patent
Paulsen et al.

(10) Patent No.: US 8,441,265 B2
(45) Date of Patent: *May 14, 2013

(54) APPARATUS AND METHOD FOR SCREENING ELECTROLYTIC CAPACITORS

(75) Inventors: Jonathan Paulsen, Greenville, SC (US); Erik Reed, Simpsonville, SC (US); Yuri Freeman, Greer, SC (US)

(73) Assignee: Kemet Electronics Corporation, Simpsonville, SC (US)

( * ) Notice: Subject to any disclaimer, the term of this patent is extended or adjusted under 35 U.S.C. 154(b) by 428 days.

This patent is subject to a terminal disclaimer.

(21) Appl. No.: 12/751,107

(22) Filed: Mar. 31, 2010

(65) Prior Publication Data

US 2010/0188099 A1 Jul. 29, 2010

Related U.S. Application Data

(60) Continuation-in-part of application No. 12/207,609, filed on Sep. 10, 2008, now abandoned, which is a division of application No. 11/641,928, filed on Dec. 18, 2006, now Pat. No. 7,671,603.

(51) Int. Cl.
*G01R 31/12* (2006.01)
(52) U.S. Cl.
USPC .......................................................... 324/548
(58) Field of Classification Search ............ 324/548
See application file for complete search history.

(56) References Cited

U.S. PATENT DOCUMENTS

| 3,387,866 | A | * | 6/1968 | Baldwin ..................... 285/184 |
| 4,216,424 | A | | 8/1980 | Vette |
| 4,419,385 | A | | 12/1983 | Peters |
| 4,425,541 | A | | 1/1984 | Burkum et al. |
| 4,906,939 | A | * | 3/1990 | Berrigan et al. ............ 324/548 |
| 5,321,367 | A | * | 6/1994 | Koscica et al. ............. 324/663 |
| 5,882,719 | A | | 3/1999 | Creasi, Jr. |
| 5,936,409 | A | | 8/1999 | Nishioka |
| 6,280,483 | B1 | | 8/2001 | Shimamoto et al. |
| 6,469,516 | B2 | * | 10/2002 | Nishioka et al. ............ 324/548 |
| 6,605,946 | B1 | | 8/2003 | Yokoyama |
| 7,671,603 | B2 | | 3/2010 | Freeman |
| 2002/0140440 | A1 | | 10/2002 | Haase |
| 2003/0002368 | A1 | | 1/2003 | Kang et al. |

OTHER PUBLICATIONS

*Conductivity Mechanisms and Breakdown Characteristics of Niobium Oxide Capacitors*, by J. Sikula et al., AVC Corporation 2003, 5 pgs.

* cited by examiner

*Primary Examiner* — Jeff Natalini
(74) *Attorney, Agent, or Firm* — Joseph T. Guy; Perkins Law Firm, LLC

(57) ABSTRACT

A method for screening electrolytic capacitors places a capacitor in series with a resistor, applying a test voltage and following the charge curve for the capacitor. A high voltage drop across the capacitor indicates high reliability and a low voltage drop is used to reject the piece. The leakage current is not adversely affected during the test.

12 Claims, 5 Drawing Sheets

APPARATUS AND METHOD FOR SCREENING ELECTROLYTIC CAPACITORS

CROSS-REFERENCE TO RELATED APPLICATIONS

The present application is a continuation-in-part of U.S. patent application Ser. No. 12/207,609 filed Sep. 10, 2008 now abandoned which is a divisional application of U.S. patent application Ser. No. 11/641,928 filed Dec. 18, 2006 now U.S. Pat. No. 7,671,603 both of which are incorporated herein by reference.

BACKGROUND OF THE INVENTION

The present invention is related to an apparatus and method for screening electrolytic capacitors. The screening can be used for culling unreliable parts from the general population of capacitors as well as for identifying the most reliable capacitors for use in special applications such as medical and military applications. The screening can be also used for diagnostic purposes for comparing different materials, manufacturing techniques and the like.

There are a variety of test methods used by manufacturers to insure quality. Test such as accelerated ageing at elevated voltage and temperature, surge tests, re-flow test, etc. are incorporated in the manufacturing process of electrolytic capacitors to display hidden defects in the dielectric and to screen for non-reliable parts. These techniques, though beneficial, cannot guarantee exclusion of all the non-reliable parts. Furthermore, when intensified these test can deteriorate the performance and reliability of the general population of the capacitors.

U.S. Pat. No. 5,882,719 issued Mar. 16, 1999 to R. Creasi is exemplary of the prior art. This patent describes a test that provides an indication of reliability at early stages of Ta capacitor manufacturing. This test comprises testing Ta capacitors in a wet cell wherein the capacitors are partially impregnated with solid electrolyte. The test uses either a static voltage, which exceeds working voltage (WV), or a gradually increasing (sweep) voltage which ultimately exceeds WV. In both cases, the applied voltage results in electrical breakdown of the dielectric in poor capacitors. Acceptable capacitors survive the test and continue through the manufacturing process.

U.S. Pat. No. 4,425,541 to Burkum et al. describes a circuit that employs a variable AC source, an AC ammeter, and an AC voltmeter to test for AC problems involving AC capacitors used in power distribution systems. The test method of Burkum et al allows for the application of variable AC voltage with adjustable frequency to an interconnected bank of AC capacitors whereby various AC voltages and currents can be measured without disturbing the connections among the capacitors of the capacitor bank. This allows for the detection of already defective capacitors that might reside among otherwise good capacitors in the interconnected capacitor bank.

U.S. Pat. No. 6,605,946 to Yokoyama describes the use of DC voltage measurements and a DC current direction detection method to assess whether current flow direction in a circuit, consisting of a battery and generator, is consistent with the known state of charge of the battery and the known state of operation of the generator wherein the state of operation is either on or off. Any inconsistency discovered during these measurements is used to force an override of the automatic control system that turns the generator on and off. The method of Yokoyama is used to detect a failure mode, which is typically not capacitor related, in a generator-battery system. The failure mode in the system tested is typically a loose or corroded wiring connection. The primary purpose of Yokoyama is to avoid an inconvenient automatic system response, such as generator shutdown, based on knowledge of an existing failure.

In spite of the advances in the art there is still an ongoing desire for a method of testing capacitors, preferably many capacitors simultaneously, which does not damage the capacitors.

SUMMARY OF THE INVENTION

It is an object of the invention to provide an improved method for screening capacitors.

It is another object of the invention to provide a method of testing capacitors wherein the reliability of capacitors can be screened without detriment to the capacitor.

A particular advantage of the present invention is the ability to screen multiple capacitors simultaneously to detect the quality of each capacitor without detriment to any capacitor being tested.

The inventive test uses breakdown voltage (BDV) as an ultimate indicator of the quality of the dielectric in the electrolytic capacitors. However, BDV testing is not suitable for use in screening finished encapsulated capacitors. The applied voltage is sufficient for breaking the dielectric and therefore causes damage to the dielectric. In finished parts the dielectric damage can not be repaired by the typical method of re-formation in a wet cell.

The purpose of the inventive screening is to imitate the BDV test for removal of unreliable parts as indicated by poor dielectric. The screening is accomplished without actually breaking the dielectric or deteriorating the quality of the tested capacitors. In the inventive screening, dc voltage which is equal to, or exceeds, average breakdown voltage (BDV) is applied to the tested capacitor. The tested capacitor is connected to a series resistor $R_s$, wherein the resistor has a resistance of at least 0.1 Mohm to no more than 10 Mohm. The voltage increase on the capacitor, as determined from the charge curve, is monitored and the test is terminated at the earlier of the voltage drop on the tested capacitor reaching average BDV or after time t, where $0.5 \text{ min} \leq t \leq 5 \text{ min}$. Final voltage drop on the capacitor indicates quality of the dielectric and is therefore suitable for use in screening capacitors.

An embodiment of the invention is provided in a method for screening a population of electrolytic capacitors. The method includes separating the population of electrolytic capacitors into a first subpopulation of electrolytic capacitors and a second subpopulation of electrolytic capacitors. An average breakdown voltage of the first subpopulation of electrolytic capacitors is determined. A dc voltage of no less than the average breakdown voltage is applied to each test capacitor of the second subpopulation of electrolytic capacitors wherein each test capacitor is connected in series to a series resistor. A charge curve across the series resistor is monitored until either a voltage reaches the average breakdown voltage or until a predetermined time is reached. The test capacitors are sorted into at least two groups wherein in a first group the voltage drop is below a predetermined level and in a second group of said groups the voltage drop is above a predetermined level.

Yet another embodiment is provided in an apparatus for screening capacitors to remove unreliable parts from a large population. The apparatus has at least one test capacitor attachment for attaching a test capacitor and a series resistor in series with the test capacitor. A first power supply is provided for providing a first voltage across the test capacitor and the series resistor. A voltage scanner is provided which is capable of measuring voltage across the series resistor. A second power supply is provided for providing a second voltage through a diode across the series resistor.

DETAILED DESCRIPTION OF THE INVENTION

The present invention is directed to an improved method for screening a population of capacitors. More particularly, the present invention is related to a method of screening capacitors, prior to the completion of manufacturing, based on the charge curve as voltage approaches breakdown voltage.

Figure 1:
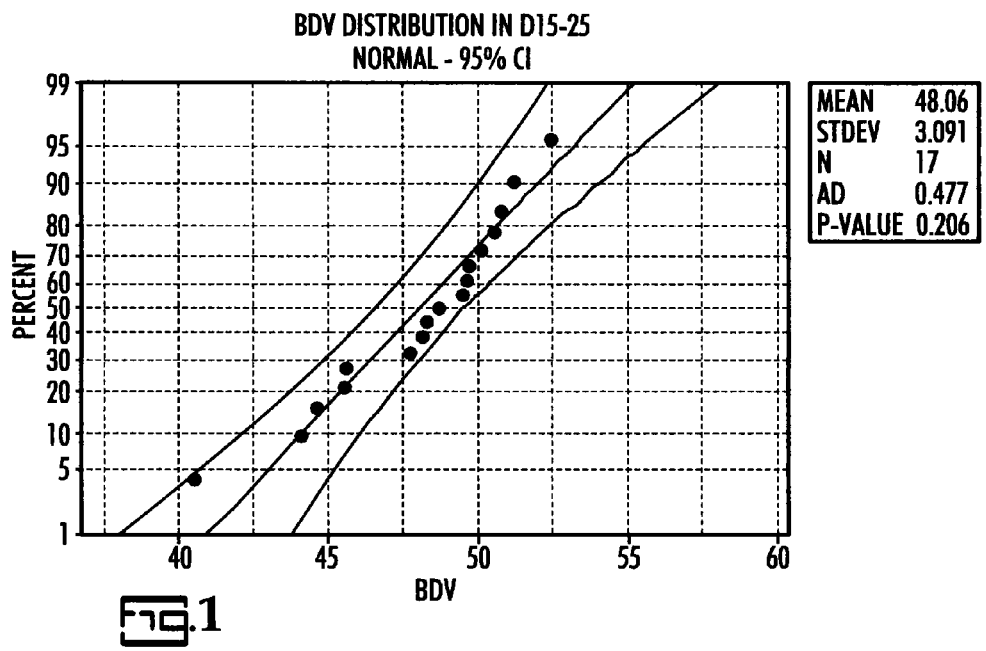
FIG. 1 shows a typical breakdown voltage distribution for a Ta capacitor 15 µF rated at 25V.

Parameters of the screening, including average BDV and series resistance $R_s$, are preferably determined on a small group of samples from a set of representative capacitors prior to the screening process. For the purposes of the present discussion the parameters are defined on a subpopulation of capacitors wherein the subpopulation is preferably sacrificial capacitors which are removed from the population after testing. To determine the average BDV, dc voltage is gradually increased on the capacitor, preferably connected to a fuse, until rapid current increase in the circuit and/or a blown fuse indicates a breakdown. As an example, FIG. 1 demonstrates typical distribution of the BDV in D-case polymer tantalum 15 uF capacitors rated at 25V.

In the distribution shown, the left "tail" with low BDV represents unreliable capacitors with weak dielectric, while the right end of the distribution, with high BDV, represents highly reliable capacitors with a robust dielectric. The BDV test can not be used for screening purposes since all the tested capacitors are electrically broken to determine the endpoint of the test.

Figure 2:
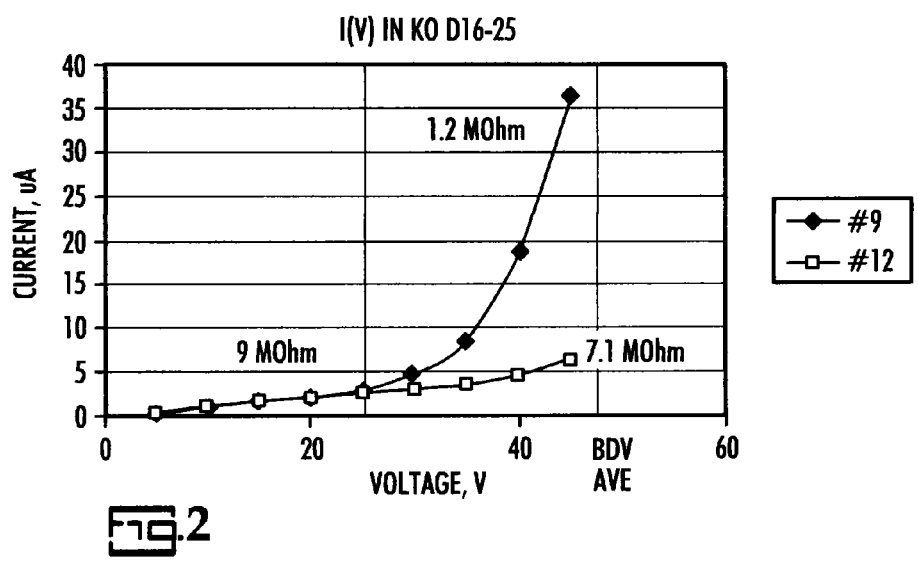
FIG. 2 shows typical current/voltage curves for D-case Ta 15 µF polymer capacitors rated at 25V.
Figure 3:
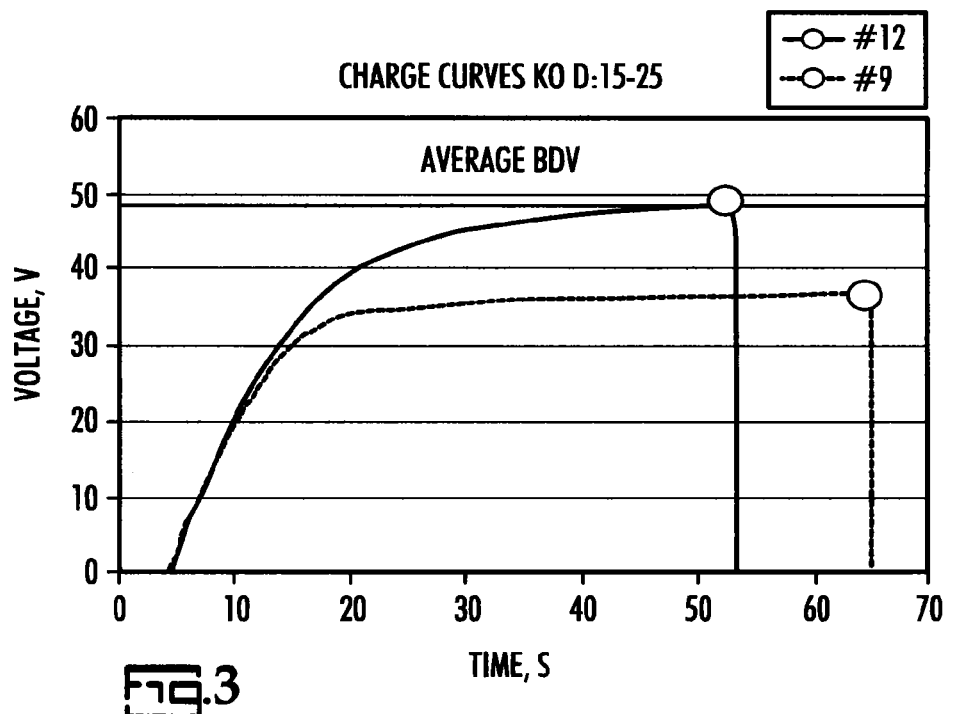
FIG. 3 shows typical charging curves for Ta polymer capacitors.

To determine series resistance $R_s$, the current (I)-vs. voltage (V) characteristics are investigated in the range of dc voltages from working voltage (WV) to the BDV. As an example, FIG. 2 shows typical I(V) characteristics of two D-case polymer tantalum 15 uF capacitors with a 25 V rating. These two capacitors have practically equal currents at WV and they are therefore indistinguishable under conventional testing. However, their currents and, thereby, resistances are distinguishable when the applied voltage approaches average BDV. High resistance in the vicinity of the average BDV correlates with high actual BDV and vice versa. The $R_s$ is chosen as an average resistance of the capacitors in vicinity of the BDV. If the resistance of the capacitor in vicinity of the BDV is lower than Rs, as in part #9, the larger part of the applied voltage will drop on the Rs, making final voltage drop on the capacitor small as shown in FIG. 3. If the resistance of the capacitor in vicinity of the BDV is higher than Rs, as in the part #12, most of the applied voltage will drop on the capacitor, making final voltage drop high (FIG. 3).

The applied dc voltage is selected to be between the average breakdown voltage and 1.5 times the average breakdown voltage. If the applied dc voltage is below average BDV, it is impossible to achieve BDV during charging. If the applied dc voltage equals average BDV, the charging time is too long. If applied dc voltages is above 1.5 times average BDV, the increase in voltage is too rapid and hampers screening accuracy.

With the average BDV and $R_s$ determined on a subpopulation comprising a small percentage of the total population, screening can be performed on all of the remaining population of the capacitors with given capacitance and rated voltage. As an example, FIG. 3 demonstrates charge curves obtained from a typical screening procedure for the two D-case polymer tantalum 15 µF capacitors rated at 25 V. In this example, average BDV was 48V, Rs was 2 Mohm, and maximum screening time, t, was 1 min.

Figure 4:
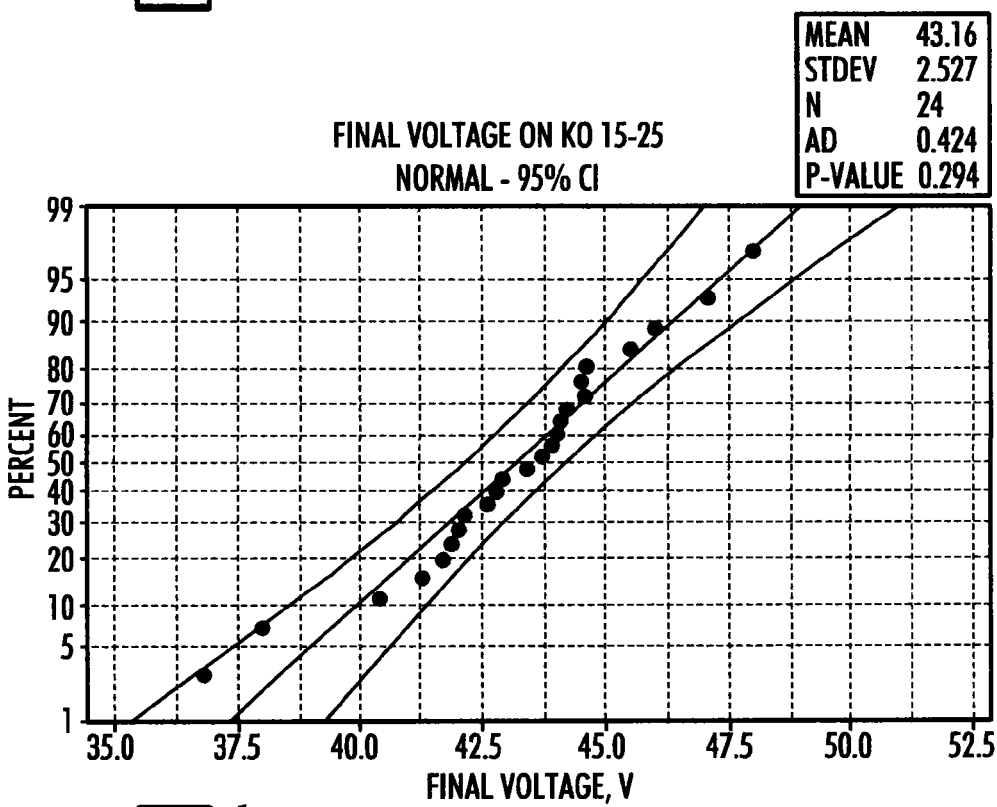
FIG. 4 illustrates typical final voltage drop distributions for 15 µF Ta polymer capacitors rated at 25V.

In FIG. 3, the voltage drop on capacitor 12 reached average BDV after 52 s at which point the voltage application was terminated. On capacitor 9 voltage drop reached its maximum at about 40 s with no further change until voltage application was terminated after about 1 min of the test. The final voltage drop on capacitor 9 was below average BDV due to noticeable voltage drop on the R. This indicates low resistance for capacitor 9, in vicinity of the average BDV which suggest weaker dielectric in the capacitor relative to capacitor 12. A representative distribution of the final voltage drop on a population of the D-case Ta polymer 15 uF capacitors rated at 25 V is shown on the FIG. 4.

The lower left part of this distribution represents unreliable capacitors with weak dielectric which would preferably be removed from the population. The central part of the population represents normal capacitors. The high right part of the population, with a high final voltage, represents exceptional quality capacitors suitable for special applications.

Figure 5:
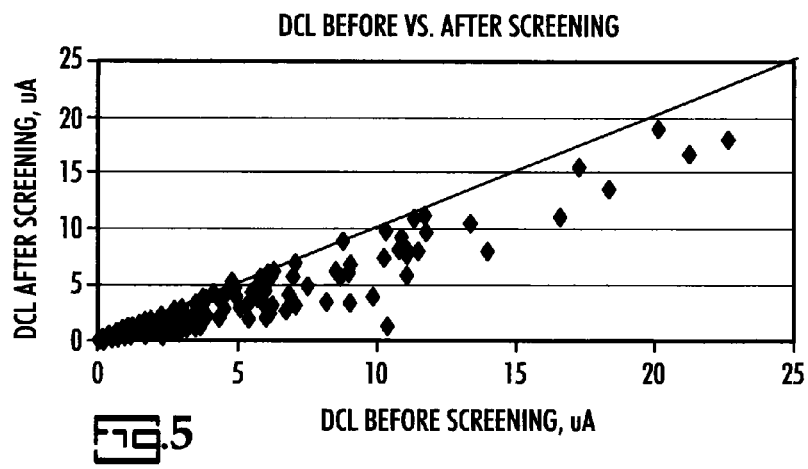
FIG. 5 shows dc leakage before and after screening using the inventive process.

To guarantee that the capacitors are not damaged during the screening, the dc leakage (DCL) at rated voltage was tested on these capacitors before and after the screening procedure with the results presented graphically in FIG. 5.

As illustrated, the experimental points are either on the diagonal or below the diagonal, which indicates no change, or an improvement in quality, of the dielectric as a result of screening. Lower DCL after the screening can be attributed to a self-healing phenomena, when high voltage is applied briefly to the capacitor in the circuit with limited current.

Figure 6:
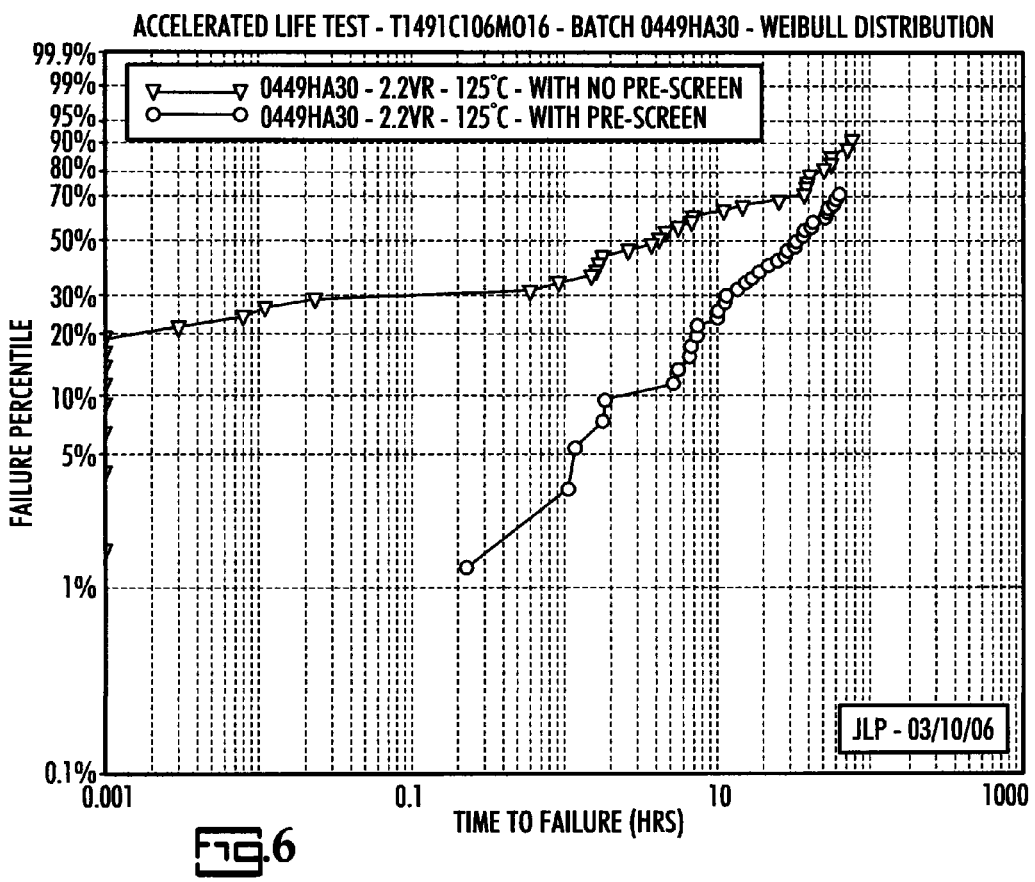
FIG. 6 shows accelerated life test distribution data at 85° C. and 1.32× rated voltage with and without the screening process.

FIG. 6 graphically demonstrates results of the accelerated life test of the capacitors with, and without, the inventive screening. During the screening, the capacitors with low final voltage drop were removed from the general population of the capacitors subjected to the accelerated test.

As illustrated in FIG. 6, screening enables the elimination of early failures. After selection by this screening, the failures start at a later time and with a much lower percentage of failed parts. Non-reliable capacitors, characterized as having a weak dielectric, can be removed from the general population by this screening method thereby avoiding subsequent manufacturing steps such as encapsulation and formation of terminals, for capacitors which are inferior and ultimately not to be sold. The distribution of the failures after the screening falls into a simple pattern, which indicates uniform degradation mechanism in the tested capacitors. In a preferred embodiment the capacitors which are considered inferior represent no more than 10% of the total population. In a particularly preferred embodiment the capacitors which are considered inferior represent no more than 1% of the total population. The capacitors which are considered inferior are typically at least 1% to no more than 10% when considering superior quality capacitors.

Figure 7:
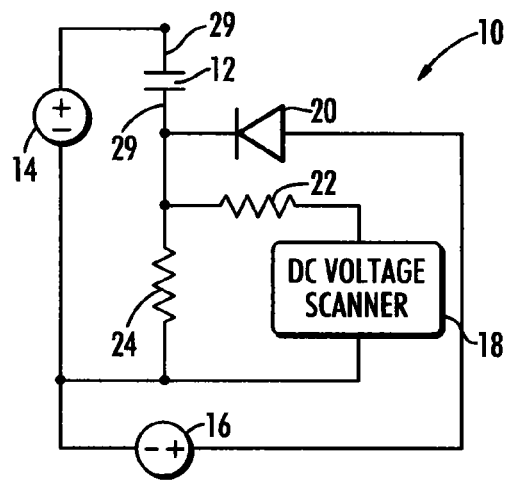
FIG. 7 is a schematic diagram of an embodiment of the invention.
Figure 8:
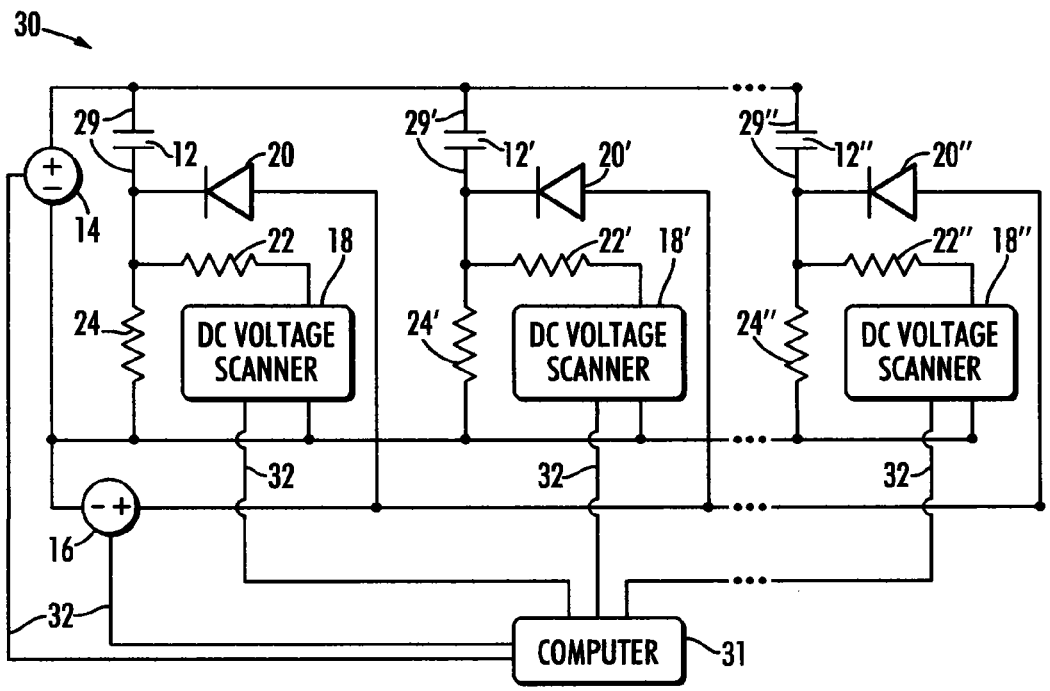
FIG. 8 is a schematic diagram of another embodiment of the invention.

An embodiment of the invention is illustrated in a schematic diagram in FIG. 7. In FIG. 7, a circuit diagram of a preferred embodiment is illustrated generally at 10. A first DC power supply, 14, provides a pre-determined voltage to the electrolytic capacitor, 12, and a series resistor, 24, of predetermined value. The test capacitor is reversibly attached to the circuit by a capacitor attachment, 29. After a pre-determined amount of time the voltage drop across the series resistor is accurately determined and, by subtraction, the voltage appearing across the capacitor is determined. A second DC source, 16, of pre-determined limiting voltage provides a voltage to the resistor through a diode, 20, to prevent the possibility of overcharging the electrolytic capacitor. This forces the voltage across the series resistor to never fall below a desired level. When the voltage across the series resistor, as determined by a DC Voltage sensor or scanner, 18, is above the minimum desired value the diode does not conduct and the second DC source is effectively disconnected from the series resistor. The voltage drop across the diode is considered when determining the voltage of the second DC source. The two pre-determined voltages, the pre-determined value of the series resistor, and the measurement time after first application of the voltages are determined according to the methods of U.S. Pat. No. 7,671,603 that describes screening electrolytic capacitors by detecting, without damaging the capacitor, a voltage that correlates with the capacitor's breakdown voltage. The purpose of the voltmeter or DC voltage scanner in FIGS. 7 and 8 is to detect the division of the voltage from the first DC source that occurs between the capacitor and the series resistor. The voltmeter, or voltage scanner, in FIGS. 7 and 8 measures the voltage across the series resistor (Rs), thereby allowing for an estimation of the capacitor's voltage in light of the pre-determined voltage of the power supply.

A second resistor, 22, is provided to raise the input resistance of the voltage detection circuit to a high enough level to consistently avoid significant loading of the voltage appearing across the series resistor, 24, during the voltage detection sampling time. The second resistor has a high resistance such as 100 megaohms. The sampling time is preferably between $0.001 < t < 10$ seconds, most preferably about 0.1 seconds. The detected voltage is scaled appropriately to account for the voltage division that occurs between the secondary resistor and the input resistance of the scanner unit which can vary but is preferably about 10 megohms.

A 100 megohm secondary resistor is preferred under most common circumstances but there are circumstances where adequate performance can be achieved when the input resistance of the voltage measurement circuit falls as low as approximately 1 megohm. There is no upper limit on the range of acceptable input resistance of the voltage measurement circuit.

A preferred embodiment of the invention is illustrated in a schematic diagram in FIG. 8 and generally represented at 30. In FIG. 8, the components are as described in FIG. 7 with additional test loops provided thereby allowing for simultaneous testing of multiple capacitors. The circuit diagram illustrated in FIG. 8 extends the circuit of FIG. 7 to accommodate concurrent screening of multiple electrolytic capacitors. Multiple circuits similar to that of FIG. 7 are connected in parallel with each test loop, or circuit, sharing the voltages provided by the first DC source, 14, and second DC source, 16. Multiple channels of voltage detection are employed, one per screening circuit. It is preferable that each voltage scanner, 18, the first DC power source, 14, and second DC power source, 16, are in communication with a computer, 31, through data links, 32. After the pre-determined period of voltage application, the voltage across each capacitor's associated series resistor is sequentially sampled by the scanner system at a rate whose period falls between $0.001 < t < 10$ seconds per channel, most preferably about 0.1 seconds per channel.

The circuits of FIGS. 7 and 8 employ variable DC sources and DC voltmeters and scanning units and are suitable for solving a DC problem estimating a performance characteristic of DC electrolytic capacitors that are used in electronic systems. The circuits of FIGS. 7 and 8 estimate the breakdown voltage of non-defective capacitors without destruction of the capacitors. Moreover, the circuits of FIGS. 7 and 8 allow for an estimation of the capacitors' various breakdown voltages without actually harming any of the capacitors in the process. The tested capacitors typically meet published specifications before screening, thus are not initially defective. Moreover, the design of the screening circuits is such as to avoid damaging the capacitors during screening so that they will continue to meet published specifications after screening.

Figure 9:
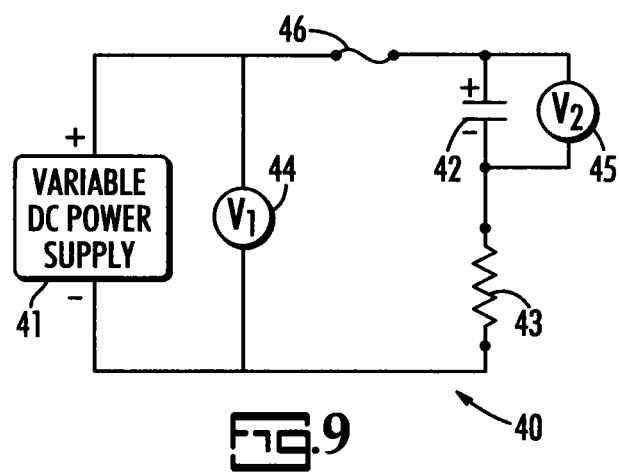
FIG. 9 is a schematic diagram of another embodiment of the invention.

A schematic diagram of an embodiment of the invention is illustrated in FIG. 9. In FIG. 9, the circuit, generally represented at 40, comprises a power supply, 41, which provides power across a test capacitor, 42, which is in series with a series resistor, 43. A first voltage scanner, 44, measures the input voltage to the test capacitor and series resistor. A second voltage scanner, 45, measures the voltage across the capacitor and therefore, the voltage drop relative to the input voltage. A fuse, 46, or circuit breaker, protects against overload.

The method of this invention may be used to remove potentially defective capacitors before completion of the manufacturing process, thereby reducing manufacturing costs by eliminating further processing of inferior capacitors. The enabled identification of higher quality units reduces returns and in-use failures.

The invention has been described in terms of representative examples which are not limitative of the scope of the invention. Modifications apparent to those with skill in the art are included within the scope of the invention.

The invention claimed is:

1. A method for screening a population of electrolytic capacitors comprising:
    separating said population of electrolytic capacitors into a first subpopulation of electrolytic capacitors and a second subpopulation of electrolytic capacitors;
    determining an average breakdown voltage of said first subpopulation of electrolytic capacitors
    applying a dc voltage of no less than said average breakdown voltage to the combination of each test capacitor of said second subpopulation of electrolytic capacitors and a series connected resistor;
    monitoring a voltage drop in a charge curve across said test capacitor until up to either said average breakdown voltage or until a predetermined time is reached; and
    sorting said test capacitors into at least two groups wherein in a first group of said groups said voltage drop is below a predetermined level and in a second group of said groups said voltage drop is above a predetermined level.

2. The method for screening a population of electrolytic capacitors of claim 1 said series resistor has a resistance of at least 0.1 Mohm to no more than 10 Mohm.

3. The method for screening a population of electrolytic capacitors of claim 1 wherein said predetermined time is at least 0.5 min to no more than 5 min.

4. The method for screening a population of electrolytic capacitors of claim 1 further comprising removing capacitors from said first group.

5. A method for screening a population of electrolytic capacitors of claim 4 wherein said first group represents 1% to 10% of said population.

6. The method for screening a population of electrolytic capacitors of claim 1 further comprising screening said capacitors.

7. The method for screening a population of electrolytic capacitors of claim 6 wherein said screening is selected from the group consisting of ageing at elevated temperature, ageing at elevated voltage, surge test and re-flow test.

8. The method for screening a population of electrolytic capacitors of claim 6 said screening is after said determining an average breakdown voltage.

9. The method for screening a population of electrolytic capacitors of claim 1 further comprising determining a resistance of said series resistance.

10. The method for screening a population of electrolytic capacitors of claim 9 wherein said determining a resistance is prior to a screening.

11. The method for screening a population of electrolytic capacitors of claim 1 wherein said dc voltage is no more than 1.5 times average breakdown voltage.

12. A method for screening a population of electrolytic capacitors comprising:

applying a dc voltage of no less than an average breakdown voltage to a combination of each electrolytic capacitor of said electrolytic capacitors and a series connected resistor;

monitoring a voltage drop in a charge curve across said electrolytic capacitor until up to either said average breakdown voltage or a predetermined time is reached; and sorting said electrolytic capacitors into at least two groups wherein in a first group of said groups said voltage drop is below a predetermined level and in a second group of said groups said voltage drop is above a predetermined level.

* * * * *